(12) United States Patent
Zheng et al.

(10) Patent No.: US 6,594,124 B2
(45) Date of Patent: Jul. 15, 2003

(54) CANTED ADJACENT LAYER STABILIZED SV HEADS

(75) Inventors: You Feng Zheng, San Jose, CA (US); Kochan Ju, Fremont, CA (US); Simon Liao, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 88 days.

(21) Appl. No.: 09/993,402

(22) Filed: Nov. 6, 2001

(65) Prior Publication Data

US 2003/0087133 A1 May 8, 2003

(51) Int. Cl.$^7$ .............................. G11B 5/127; G11B 5/39
(52) U.S. Cl. ........... 360/324.12; 360/328; 428/694 EC; 428/694 TM; 148/103
(58) Field of Search ..................... 360/324.1, 324.11, 360/324.12, 327.21, 327.24, 328, 313, 320, 321, 322; 365/158; 148/100, 103, 108; 29/603.01, 603.04, 603.07, 603.08, 603.13, 603.14, 604, 619; 428/611, 64.3, 692, 693, 694 R, 694 MM, 694 EC, 694 IS, 694 T, 694 TP, 694 TM, 697

(56) References Cited

U.S. PATENT DOCUMENTS

| | | | |
|---|---|---|---|
| 5,325,253 A | 6/1994 | Chen et al. ................. 360/113 |
| 5,680,281 A | 10/1997 | Kung et al. ................. 360/113 |
| 5,828,531 A * | 10/1998 | Gill ....................... 360/324.12 |
| 5,856,897 A | 1/1999 | Mauri ........................ 360/113 |
| 5,859,754 A | 1/1999 | Tong et al. ................. 360/113 |
| 5,958,611 A | 9/1999 | Ohta et al. ................. 428/692 |
| 5,995,338 A | 11/1999 | Watanabe et al. ........... 360/113 |
| 6,219,211 B1 * | 4/2001 | Gill ........................ 360/324.11 |
| 6,230,390 B1 | 5/2001 | Guo et al. ................ 29/603.14 |
| 6,462,541 B1 * | 10/2002 | Wang et al. ............. 360/324.1 |
| 6,466,419 B1 * | 10/2002 | Mao ....................... 360/324.12 |

* cited by examiner

Primary Examiner—Stevan A. Resan
Assistant Examiner—Louis Falasco
(74) Attorney, Agent, or Firm—George O. Saile; Stephen B. Ackerman

(57) ABSTRACT

An improved stabilization scheme for a GMR read head is described. Two important changes relative to prior art designs have been introduced. Instead of biasing by means of a permanent magnet or through exchange coupling with an antiferromagnetic layer, the magnetostatic field emanating from a nearby, but not contiguous, layer is used. Additionally, to obtain optimum stability with this scheme the bias, instead of running parallel to the easy axis of the free layer, is canted away from it towards the direction of the demagnetizing field of the pinned layer. A process for the manufacture of the structure is also described.

18 Claims, 4 Drawing Sheets

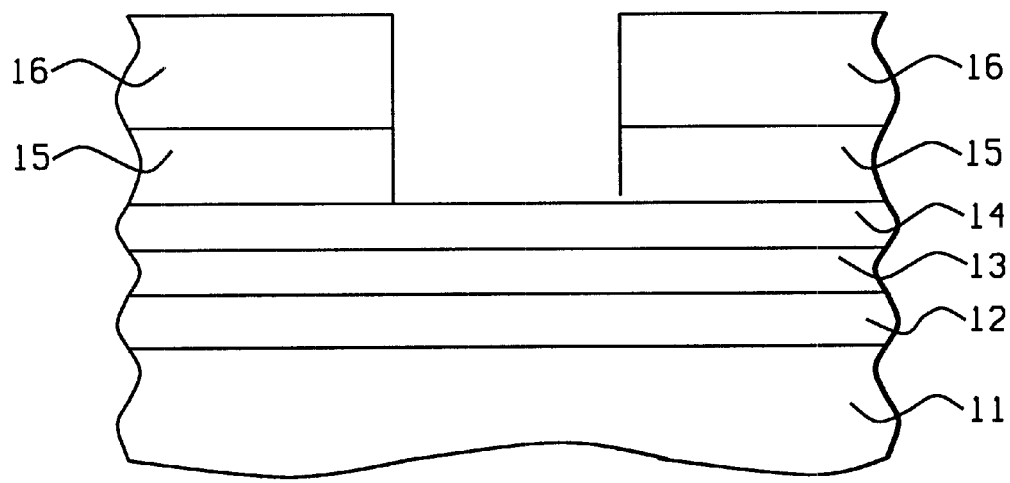
FIG. 1 – Prior Art
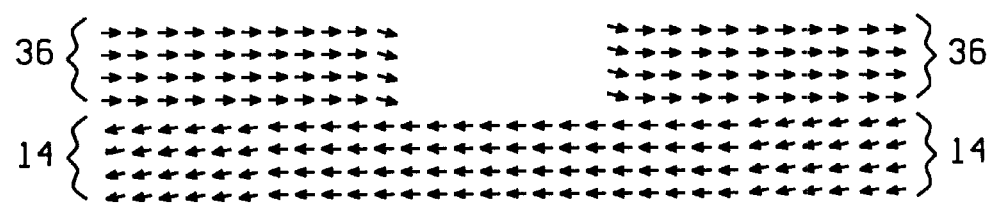
FIG. 2a

CANTED ADJACENT LAYER STABILIZED SV HEADS

FIELD OF THE INVENTION

The invention relates to the general field of magnetic disks with particular reference to GMR read heads and ways to ensure lateral stabilization.

BACKGROUND OF THE INVENTION

The read element in a magnetic disk system is a thin slice of material, located between two magnetic shields, whose electrical resistivity changes on exposure to a magnetic field. Magneto-resistance can be significantly increased by means of a structure known as a spin valve (SV). The resulting increase (known as Giant magneto-resistance or GMR) derives from the fact that electrons in a magnetized solid are subject to significantly less scattering by the lattice when their own magnetization vectors (due to spin) are parallel (as opposed to anti-parallel) to the direction of magnetization of the solid as a whole.

The key elements of a spin valve structure are two magnetic layers separated by a non-magnetic layer. The thickness of the non-magnetic layer is chosen so that the magnetic layers are sufficiently far apart for exchange effects to be negligible but are close enough to be within the mean free path of conduction electrons in the material. If the two magnetic layers are magnetized in opposite directions and a current is passed through them along the direction of magnetization, half the electrons in each layer will be subject to increased scattering while half will be unaffected (to a first approximation) Furthermore, only the unaffected electrons will have mean free paths long enough for them to have a high probability of crossing the non magnetic layer. Once these electrons have crossed the non-magnetic layer, they are immediately subject to increased scattering, thereby becoming unlikely to return to their original side, the overall result being a significant increase in the resistance of the entire structure.

In order to make use of the GMR effect, the direction of magnetization of one the layers must be permanently fixed, or pinned. The other layer, by contrast, is a "free layer" whose direction of magnetization can be readily changed by an external field (such as that associated with a bit at the surface of a magnetic disk). Structures in which the pinned layer is at the top are referred to as top spin valves. Similarly, in a bottom spin valve structure the pinned layer is at the bottom.

Although not directly connected to the GMR effect, an important feature of spin valve structures is a pair of longitudinal bias stripes that are permanently magnetized in a direction parallel to the long dimension of the device. In the prior art, longitudinal bias layers have been implemented as permanent magnets by using a hard magnetic material. However, this approach results in a "dead zone" over which the sensitivity is very low and reduces the overall reader sensitivity. The impact of the "dead zone" becomes more severe at high track density.

An alternative to the commonly used abutted junction stabilization scheme is the "boundary exchange" (BE) biased stabilization scheme. In this scheme, an antiferromagnetic film is placed on the top of the free layer at each side to replace abutted permanent magnets in the conventional abutted junction heads. The magnetization at the side region of the free layer is pinned by the interfacial antiferromagnetic exchange coupling field. The sensor region at the center of the free layer, on the other hand, is free of any pinning field. This design eliminates the "dead zone" problem and therefore significantly increases the reader sensitivity.

In order to obtain sufficient antiferromagnetic exchange coupling with the free layer, the interface between the free layer and the AFM layer needs to be fresh and clean. The prior art has dealt with this problem by partially etching away the free layer at the side region and then refilling with free layer material, following up by the deposition of the AFM film layer. However, this approach is becoming progressively more difficulty as the free layer grows thinner, due to difficulties in etch control and surface cleaning.

FIG. 1 is a schematic view of a prior art "boundary exchange" bias stabilization head. The figure shows a bottom spin valve of the prior art in which the longitudinal bias is of this type. Seen there is substrate 11 which supports pinned layer 12. Layer 13 is the non-magnetic spacer layer and layer 14 is the free layer. Antiferromagnetic stripes 15 provide the longitudinal bias while layer 16 represents the conductive leads. The problems associated with this approach are increased processing difficulties with the free layer where it is partially removed before depositing the top AFM.

A routine search of the prior art was performed with the following references of interest being found:

In U.S. Pat. No. 5,325,253, Chen et al. show a stabilized MR transducer using a canted exchange bias. An antiferromagnetic layer directly contacts the side region of the free layer to bias the magnetization in the side region of the free layer in the desired direction, in a similar manner to that illustrated in FIG. 1. There is no GMR capping layer no layer between the free layer and the biasing layer, the antiferromagnetic layer being in direct contact with the free layer. Canting is used in U.S. Pat. No. 5,325,253 to align the magnetization at the side region of the free layer to be parallel to that in the center active region of the free layer, therefore eliminating the free charges due to magnetic moment mismatch between the side region and the center region and improving stability.

Kung et al. (U.S. Pat. No. 5,680,281) show an edge (horizontal)-biased MR sensor. U.S. Pat. No. 5,958,611 (Ohta et al.), U.S. Pat. No. 5,856,897 (Mauri et al.), U.S. Pat. No. 5,859,754 (Tong et al.), U.S. Pat. No. 6,230,390 (Guo et al.), and U.S. Pat. No. 5,995,338 (Watanabe et al.) are related patents.

SUMMARY OF THE INVENTION

It has been an object of at least one embodiment of the present invention to provide a horizontal stabilization scheme for a spin valve structure.

Another object of at least one embodiment of the present invention has been that said structure not suffer instability problems arising from multiple domain states.

Yet another object of at least one embodiment of the present invention has been that said structure should keep the free layer from being attacked during wafer fabrication.

Still another object of at least one embodiment of the present invention has been that said structure provide improved side reading suppression.

A further object of at least one embodiment of the present invention has been to provide a process for manufacturing said structure.

These objects have been achieved by introducing two important changes into prior art designs for longitudinal biasing schemes. Instead of biasing by means of a permanent magnet or through exchange coupling with an antiferromagnetic layer the magnetostatic field emanating from a nearby, but not contiguous, layer is used. Further, to obtain optimum stability with this scheme the bias, instead of running parallel to the easy axis of the free layer, is canted away from it towards the direction of the demagnetizing field of the pinned layer. This canted bias field is applied to the free layer through magnetostatic coupling which does not require direct contact between the bias and free layers. This approach simplifies the manufacture of the structure since close control of etching (to remove part of the free layer) is no longer needed and a capping layer may be laid down over the free layer immediately following its deposition, thereby protecting it from contamination.

BRIEF DESCRIPTION OF THE DRAWINGS

FIG. 1 illustrates how longitudinal bias leads appear in a structure of the prior art.

FIGS. 2a–b illustrate bias leads similar to the present invention, but without canting.

DESCRIPTION OF THE PREFERRED EMBODIMENTS

Figure 3:
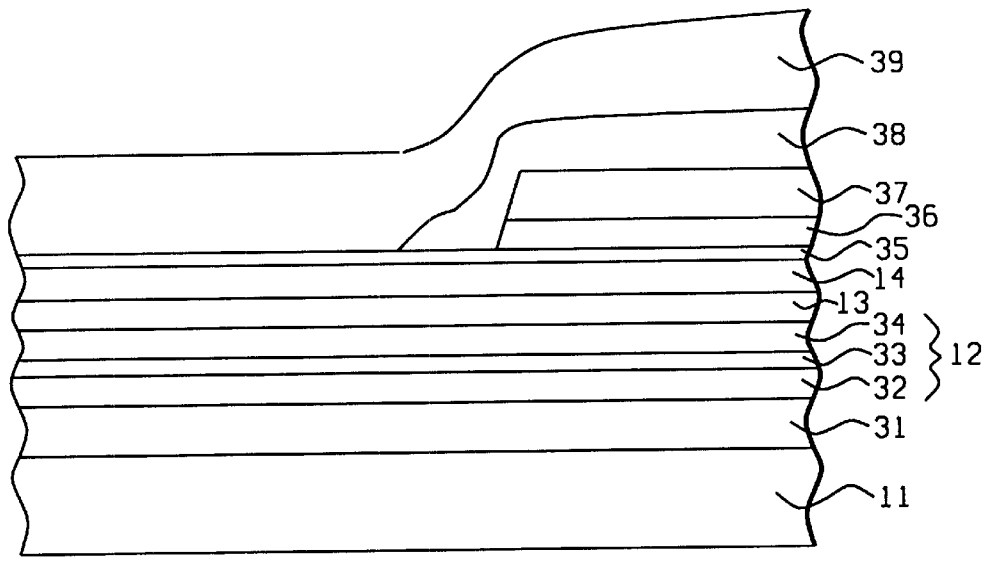
FIG. 3 shows a schematic cross-sectional view of the structure of the present invention.

Referring now to FIG. 3, we show there the structure of the present invention which is manufactured according to the following process:

Beginning with dielectric layer 11 typically aluminum oxide, the process begins with the deposition of antiferromagnetic layer 31 on whose surface pinned layer 12 is formed. A range of possible materials may be selected for use in layer 12 provided it has been magnetized in a pre-specified direction, which we will call direction 1, which will be discussed in greater detail below. Our preferred material for layer 12 has been a laminate of three layers formed by first depositing layer 32 of CoFe to a thickness between about 10 and 30 Angstroms, then depositing layer 33 of ruthenium to a thickness between about 6 and 10 Angstroms and finally depositing second layer 34 of CoFe to a thickness between about 10 and 30 Angstroms. Layers 32 and 34 are arranged to be magnetically anti-parallel to one another.

Non-magnetic spacer layer 13, typically copper, is then deposited on layer 34 followed by the deposition thereon of free layer 14 whose easy axis lies in direction 2. Then, capping layer 35 is deposited over the free layer. This is an important departure from prior art practice when forming similar structures, as discussed earlier. Capping layer 35 is a material such as Ta, FeTa, Ru, NiCr, or Cu and is between about 5 and 30 Å thick.

Next, as a key feature of the invention, soft ferromagnetic layer 36 is deposited onto capping layer 35 followed by the deposition thereon of second antiferromagnetic layer 37. Layers 36 and 37 are then patterned to form a pair of opposing stripes separated by a spacing of between about 0.05 and 1 micron (corresponding to 26 in FIG. 2a and depending on the track density of the design—currently about 0.1 to 0.3 microns). Layer 36 is a soft ferromagnetic material such as NiFe, Ni, CoFe, and laminated NiFe/CoFe, and is between about 10 and 150 Angstroms thick. Layer 37 is an antiferromagnetic material such as PtMn, IrMn, NiMn, FeMn, or PdPtMn and is between about 30 and 300 Angstroms thick, depending on which material is selected.

Next, the structure is annealed in two steps: First, AFM layer 31 is annealed in a magnetic field of about 10 kOe, along direction 1, at a temperature of about 280° C. for about 5 hours. This is followed by the annealing of layer 37 in a magnetic field of of about 100 Oe, canted to the desired direction, at a temperature of about 250° C. for about 10 hours. This canted magnetic field is oriented in direction 3 which lies somewhere between directions 1 and 2. The result is that the wing region of the free layer 14, through magnetostatic interaction with layer 36, is given a magnetic bias in the vertical direction. The angle between directions 2 and 3 is between about 30 and 80 degrees.

The process ends with the selective coating of stripes 36/37 with conductive material to form a pair of conductive leads 38 followed by the deposition of dielectric layer 39.

Thus the process of the present invention provides a longitudinal bias that derives from the magnetostatic field from soft ferromagnetic (SFM) layer 36 instead of from antiferromagnetic exchange coupling (such as with layer 15 in prior art FIG. 1). This allows GMR capping layer 35 to be placed over the free layer as soon as the latter has been deposited, thereby maintaining its integrity through subsequent manufacturing steps.

We have already alluded to the other important feature of this structure that is needed for its optimum operation. The magnetostatic field from the SFM layer is bi-directional at the junction region which leads to the existence of multiple magnetization states. FIG. 2a shows plan views of layers 14 and 36 (including a single stripe 24, encoded by being magnetized in direction 25, which will shortly be sensed by its effect on 22 which is moving in direction 23).

Figure 2B:
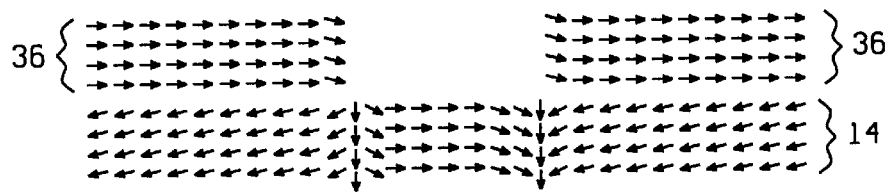

FIG. 2a shows the case where the magnetic moment in the center region 22 of the free layer rotates to the opposite direction due to insufficient longitudinal bias field from SFM layer 36. At sufficient bias field, however, the magnetization in the junction region forms a 180° domain wall, as shown in FIG. 2b as 28. This domain pattern is energetically unfavorable and will cause complicated and unpredictable magnetization behaviors in the free layer because of the discontinuity of magnetic moment between the active region and the side region.

Figure 4:
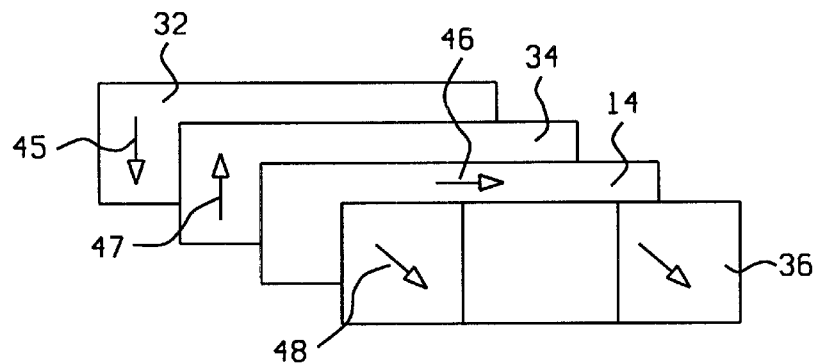
FIG. 4 shows the various magnetization directions associated with several of the layers seen in FIG. 3.

To overcome this problem, the present invention, instead of setting the exchange coupling field along the horizontal direction (arrow 46), which would be the conventional thing to do, the field here is canted relative to direction 46. This is illustrated in FIG. 4 which shows the direction of magnetization in each of the layers. Note that, for simplification purposes, layers 13 and 33 are not shown here. The canting direction is chosen so that the transverse component of the magnetostatic field from the SFM layer is in the same direction as the net magnetic moment direction of the anti-parallel (AP) layers in order to prevent the AP layers from demagnetizing. For the case shown in FIG. 4, we assume the AP1 layer is thicker than the AP2 layer. The net magnetic moment of the AP layer is upwards. So the SFM layer canting direction is set to be downwards. So, in the figure, the net moment of the AP layers is upwards, as symbolized by arrow 47. The canting direction in the SFM layer is therefore set to be the opposite which in this example is downwards (direction 48).

Figure 5:
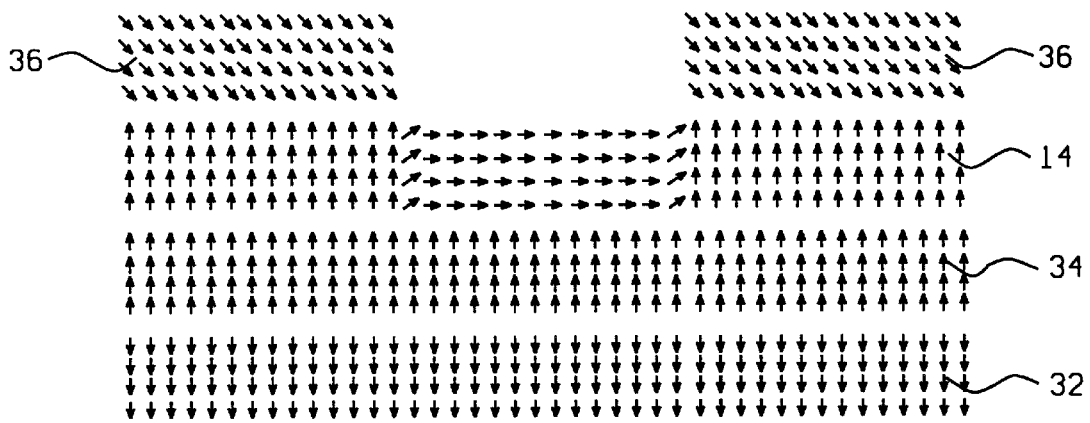
FIG. 5 shows additional detail concerning magnetization of layers from FIG. 3.

FIG. 5 is a simulated magnetization configuration for a typical canted biased heads. The magnetic moment at the side regions of free layer 14 has been oriented into the transverse direction (downward arrows in this example) under the influence of the magnetostatic field associated with the SFM layer (36 and 37). Accordingly, biasing stripes 36 have been canted away from the horizontal in the opposite direction (resulting in diagonal arrows, as shown). Typically, we found a canting angle between about 30 and 80 degrees to be effective, with 60 degrees being preferred.

As FIG. 5 schematically illustrates, the transition from horizontal to vertical magnetization that occurs at the boundaries between the central and side portions of free layer 14 are much more gradual than it was for the case shown in FIG. 2b. As a result, the bias scheme disclosed by the present invention eliminates the existence of multiple domain states and stabilizes it relative to a non-canted bias scheme. This improves both head stability and track width definition. Since the magnetic moment at the side region of the free layer is parallel to the signal field, it is insensitive to the flux and the signal contribution from the side region is therefore minimized.

We also note here that the bias scheme of the present invention is not dependent on use of a lead overlaid structure such as the one illustrated in FIG. 3 and could be used with an aligned lead and an SFM layer.

Results

Figure 6:
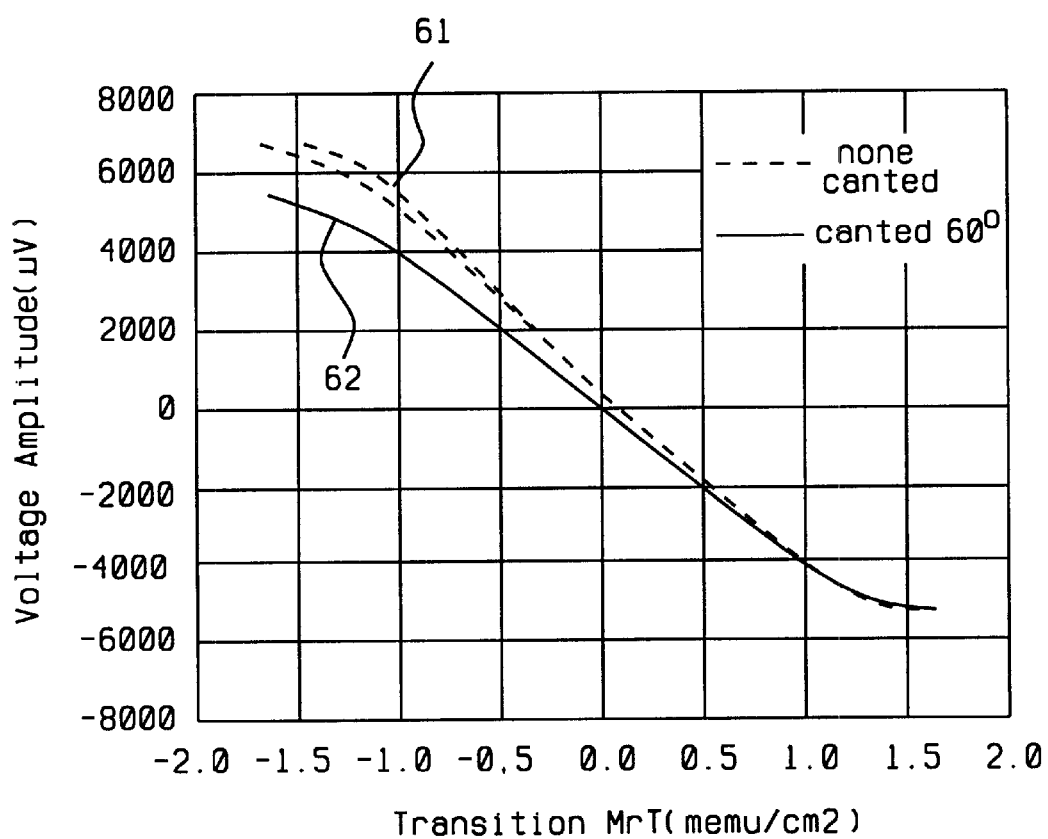
FIG. 6 compares performance of structures in which convnetional bias and canted bias leads are used.

In FIG. 6 we compare performance of canted and non-canted structures. Curves 61 and 62 are for the non-canted and canted structures, respectively, and show voltage amplitude as a function transition MrT (magnetic moment× thickness) in memu/cm$^2$ (standard unit for magnetic moment in cgs system). The moment ratio between the SFM layer and the free layer for the non-canted case is 3 while for the canted case it is 2. Without canting the exchange bias field, the transfer curve shows loop opening and asymmetry, indicating instability during the head operation. It is found that at least 4 times the moment ratio is required to stabilize the center active region at the desired direction in the non-canted case. However, after canting the exchange bias field to 60° downwards, 2 times the moment ratio is sufficient to stabilize the active region of the free layer.

What is claimed is:

1. A process for manufacturing a bottom spin valve, comprising:

on a dielectric layer, depositing a first antiferromagnetic layer;

on the first antiferromagnetic layer, forming a pinned layer that has been magnetized in a first direction;

on the pinned layer, depositing a non-magnetic spacer layer;

on the spacer layer, depositing a free layer having an easy axis in a second direction;

on the free layer, depositing a capping layer;

on the capping layer, depositing a soft ferromagnetic layer;

on the soft ferromagnetic layer, depositing a second antiferromagnetic layer;

patterning the soft ferromagnetic and second antiferromagnetic layers to form a pair of opposing stripes separated by a spacing;

annealing said pair of stripes in a magnetic field having a third direction that is between said first and second directions, thereby causing said free layer, through magnetostatic interaction with said soft ferromagnetic layer, to have a magnetic bias whose direction is between that of said easy axis and said pinned layer magnetization; and selectively coating said stripes with conductive material to form a pair of conductive leads.

2. The process described in claim 1 wherein said third direction subtends an angle of between about 30 and 80 degrees relative to said second direction.

3. The process described in claim 1 wherein the step of annealing said stripes in a magnetic field further comprises heating at a temperature between about 200 and 300° C. for about 10 hours in a magnetic field of between about 100 and 300 oersted.

4. The process described in claim 1 wherein the step of forming a magnetically pinned layer further comprises:

depositing a first layer of CoFe to a thickness between about 10 and 30 Angstroms;

depositing a layer of ruthenium between about 6 and 10 Angstroms thick; and depositing a second layer of CoFe to a thickness between about 10 and 30 Angstroms, said second layer of CoFe being magnetically anti-parallel to said first layer of CoFe.

5. The process described in claim 1 wherein said soft ferromagnetic layer is selected from the group consisting of NiFe, Ni, CoFe, and NiFe/CoFe laminate.

6. The process described in claim 1 wherein said soft ferromagnetic layer is deposited to a thickness between about 10 and 150 Angstroms.

7. The process described in claim 1 wherein said second antiferromagnetic layer is selected from the group consisting of PtMn, IrMn, NiMn, FeMn, and PdPtMn.

8. The process described in claim 1 wherein said capping layer is selected from the group consisting of Ta, Ru, FeTa, Cu, and NiCr.

9. The process described in claim 1 wherein said capping layer is deposited to a thickness between about 5 and 30 Angstroms.

10. A bottom spin valve structure, comprising:

a first antiferromagnetic layer on a dielectric layer;

on said first antiferromagnetic layer, a magnetically pinned layer that has been magnetized in a first direction;

on the magnetically pinned layer, a non-magnetic spacer layer;

on the spacer layer, a free layer having an easy axis in a second direction;

on the free layer, a capping layer;

on the capping layer, a soft ferromagnetic layer;

on the soft ferromagnetic layer, a second antiferromagnetic layer;

said soft ferromagnetic and second antiferromagnetic layers having been patterned to form a pair of opposing stripes separated by a spacing;

said pair of stripes being magnetized in a third direction that is between said first and second directions, whereby said free layer, as a result of magnetostatic interaction with said soft ferromagnetic layer, has a magnetic bias that is in a vertical direction; and said stripes having been selectively coated with conductive material whereby they form a pair of conductive leads.

11. The structure described in claim 10 wherein said third direction subtends an angle of between about 30 and 80 degrees relative to said second direction.

12. The structure described in claim 10 wherein the magnetically pinned layer further comprises:

a first layer of CoFe having a thickness between about 10 and 30 Angstroms;

a layer of ruthenium between about 6 and 10 Angstroms thick on said first layer of CoFe; and a second layer of CoFe, having a thickness between about 10 and 30 Angstroms, on said layer of ruthenium, with said second layer of CoFe being magnetically antiparallel to said first layer of CoFe.

13. The structure described in claim 10 wherein said soft ferromagnetic layer is selected from the group consisting of NiFe, Ni, CoFe, and NiFe/CoFe laminate.

14. The structure described in claim 10 wherein said soft ferromagnetic layer has a thickness between about 10 and 150 Angstroms.

15. The structure described in claim 10 wherein said second antiferromagnetic layer is selected from the group consisting of PtMn, IrMn, NiMn, FeMn, and PdPtMn.

16. The structure described in claim 10 wherein said capping layer is selected from the group consisting of Ta, Ru, FeTa, Cu, and NiCr Ta, Ru, FeTa, Cu, and NiCr.

17. The structure described in claim 10 wherein said spacing between the stripes is between about 0.05 and 1 microns.

18. The structure described in claim 10 wherein said capping layer has a thickness between about 5 and 30 Angstroms.

* * * * *